United States Patent [19]
Park et al.

[11] Patent Number: 5,387,913
[45] Date of Patent: Feb. 7, 1995

[54] RECEIVER WITH DIGITAL TUNING AND METHOD THEREFOR

[75] Inventors: Sangil Park; Dion D. Messer, both of Austin, Tex.

[73] Assignee: Motorola, Inc., Schaumburg, Ill.

[21] Appl. No.: 149,392

[22] Filed: Nov. 9, 1993

[51] Int. Cl.[6] .............................................. H03M 1/12
[52] U.S. Cl. ..................................... 341/155; 455/214
[58] Field of Search ............... 341/155, 156, 157, 158, 341/163, 143; 455/214, 296, 160, 303, 304; 375/26, 27

[56]  References Cited
U.S. PATENT DOCUMENTS

| | | | |
|---|---|---|---|
| 4,902,979 | 2/1990 | Puckette | 329/343 |
| 5,113,189 | 5/1992 | Messer et al. | 341/143 |
| 5,146,186 | 9/1992 | Vella | 331/16 |
| 5,249,204 | 9/1993 | Funderburk et al. | 375/97 |
| 5,254,958 | 10/1993 | Flach et al. | 331/10 |

*Primary Examiner*—Brian K. Young
*Attorney, Agent, or Firm*—Paul J. Polansky

[57] ABSTRACT

A receiver (20) digitally tunes a radio frequency (RF) signal at the same time that it mixes the RF signal to a frequency suitable for demodulation and channel separation. A clock frequency divider (35) receives a reference clock signal, and divides the reference clock signal to provide a divided signal at a predetermined frequency, such as 20 kHz for AM stereo. A clock frequency multiplier (36) receives the divided signal and a digital tuning input signal, and provides an analog tuning signal at a multiple of the divided signal as determined by the digital tuning input signal. An analog multiplier (31) then mixes the RF signal with the analog tuning signal. An analog-to-digital converter (ADC) (32) receives an output of the analog multiplier (31), and is clocked by the reference clock signal to eliminate any clock phase error. A digital demodulator (38) then demodulates and further processes an output of the ADC (32).

19 Claims, 2 Drawing Sheets

RECEIVER WITH DIGITAL TUNING AND METHOD THEREFOR

FIELD OF THE INVENTION

This invention relates generally to signal processing, and more particularly, to tuning systems and methods for receivers.

BACKGROUND OF THE INVENTION

A classical amplitude modulation (AM) radio receiver received a modulated radio frequency (RF) signal through an antenna, tuned a frequency of interest in the radio frequency down to baseband, and demodulated the signal. For example, U.S. entertainment AM radio includes frequencies in the range of 520 kilohertz (kHz) to 1680 kHz. The classical AM receiver used an antenna capable of receiving frequencies over this frequency band. This receiver mixed the signal down to baseband using a sinusoidal wave generated by a tuning circuit. The receiver then demodulated the baseband signal by envelope detection.

A listener tuned the classical receiver by turning a large knob, which was connected to a variable capacitor or a variable resistor. The variable capacitance or resistance changed the resonance frequency of an oscillator circuit, which then changed the frequency of the signal modulated down to baseband. While the classical AM receiver has been known and used for several decades, it has a few problems. First, the tuning is inexact, and the user had to rely the clarity of the signal he heard from the loudspeaker rather than the markings on the tuning knob to precisely tune a desired frequency. Also, the resonance frequency tended to drift over time as the components heated up. In addition, these components were bulky and expensive.

Digital tuning offered a significant improvement over the analog tuning used in the classical receiver. In digital tuning, resistances or capacitances are discretely switched into the resonator circuit. This type of tuning allows a digital display to indicate the frequency tuned by the user, and thus is superior to the analog tuning knob. However, this type of digital tuning also requires a large number of components and thus requires a large amount of circuit board area, and it would be desirable to further reduce the cost and board space of a receiver using this digital tuning circuit.

Another advance in technology which improves upon the classical radio receiver is the emergence of digital technology. Digital technology allows the received signal to be converted to a digital signal in an analog-to-digital converter, and then demodulated in the digital domain. Converting the signal to digital form also allows noise filtering using digital signal processing techniques. However, a problem with this approach is that the tuning signal remains unsynchronized to the clock used by the analog-to-digital converter, resulting in phase error in the demodulated signals and ultimately reduced resolution of the signal. What is needed, then, is a new radio receiver which further reduces cost and improves performance over known receivers.

SUMMARY OF THE INVENTION

Accordingly, the present invention provides, in one form, a receiver with digital tuning including an input terminal for receiving a modulated signal, an analog multiplier, an analog-to-digital converter (ADC), a divider portion, and a multiplier portion. The analog multiplier has a first input coupled to the input terminal, a second input for receiving an analog tuning signal, and an output for providing a tuned analog signal. The ADC has an input for receiving the tuned analog signal, and an output for providing a tuned digital signal. The divider portion receives a reference clock signal, and provides a first divided signal at a predetermined frequency in response thereto. The multiplier portion is coupled to the divider portion, receives a digital tuning input signal and the first divided signal, and provides the analog tuning signal at a frequency equal to a multiple of the predetermined frequency as determined by the digital tuning input signal.

In another form, the present invention provides a method for digitally tuning a receiver. A modulated signal is received at an input of the receiver. The modulated signal is multiplied by an analog signal to provide a tuned analog signal. The tuned analog signal is converted to a tuned digital signal. A first divided signal is provided at a predetermined frequency, and a digital tuning input signal is received. The analog tuning input signal is provided having a frequency equal to a programmable multiple of the first divided signal as determined by the digital tuning input signal.

These and other features and advantages will be more clearly understood from the following detailed description taken in conjunction with the accompanying drawings.

DETAILED DESCRIPTION OF A PREFERRED EMBODIMENT

Generally, the present invention provides a receiver with digital tuning and a method for digitally tuning a receiver. The digital tuning circuit and method of operation described herein not only provide accurate demodulation of RF signals but also maximize the reduction of analog components for lowest cost. Demodulating a selected RF signal is accomplished by generating a digital pulse signal whose frequency is predetermined to down-convert the RF carrier frequency. Then the digital pulse signal is fed into an analog multiplier to demodulate the RF signal into predetermined lowband carrier frequency (e.g. 20 kHz). This lowband carrier frequency not only preserves quadrature amplitude modulation (QAM) complex signal spectra, but also serves to convert the signal down to a low enough frequency band to digitally sample the signal with an existing high-performance analog-to-digital converter (ADC), such as a 16-bit sigma-delta ADC. Even though the digital pulse signal has a fundamental frequency spectrum as well as all odd harmonic frequency spectra which are explained as all integer multiples of the fundamental frequency, the harmonic frequency components are intrinsically digitally filtered out by the sigma-delta ADC.

Existing analog and digital tuning circuits use an analog voltage controlled oscillator (VCO) to generate the local carrier to demodulate the RF signal to an IF (intermediate frequency) signal. The VCO circuit, which consists of many discrete components, generates a sinusoidal signal by resonating to a frequency depending on the value of input analog voltage. Normally, the input voltage is generated by a digital-to-analog converter (DAC) which is controlled by a digital number fed from a main microcontroller. This approach requires a large board area and many discrete components. Also, this analog approach has a wide tolerance, thereby making the tuning frequency vary over a wide range for a given input voltage to the VCO. This, in turn, requires higher-tolerance phase locked loop (PLL) circuits to adjust the locking frequency resolution.

Figure 1:
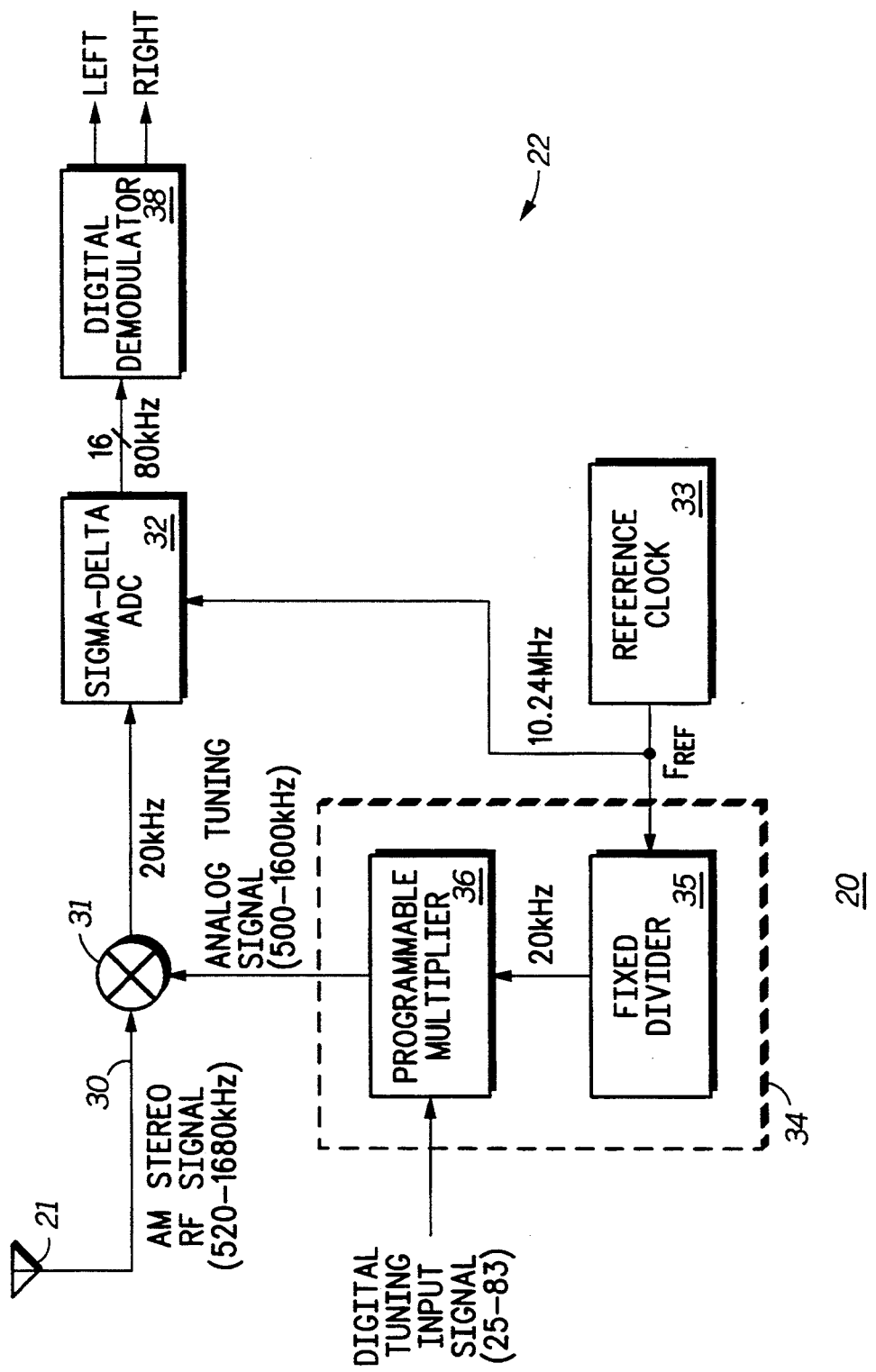
FIG. 1 illustrates in partial block diagram, partial logic diagram, and partial schematic diagram form a receiver with digital tuning in accordance with the present invention.
Figure 2:
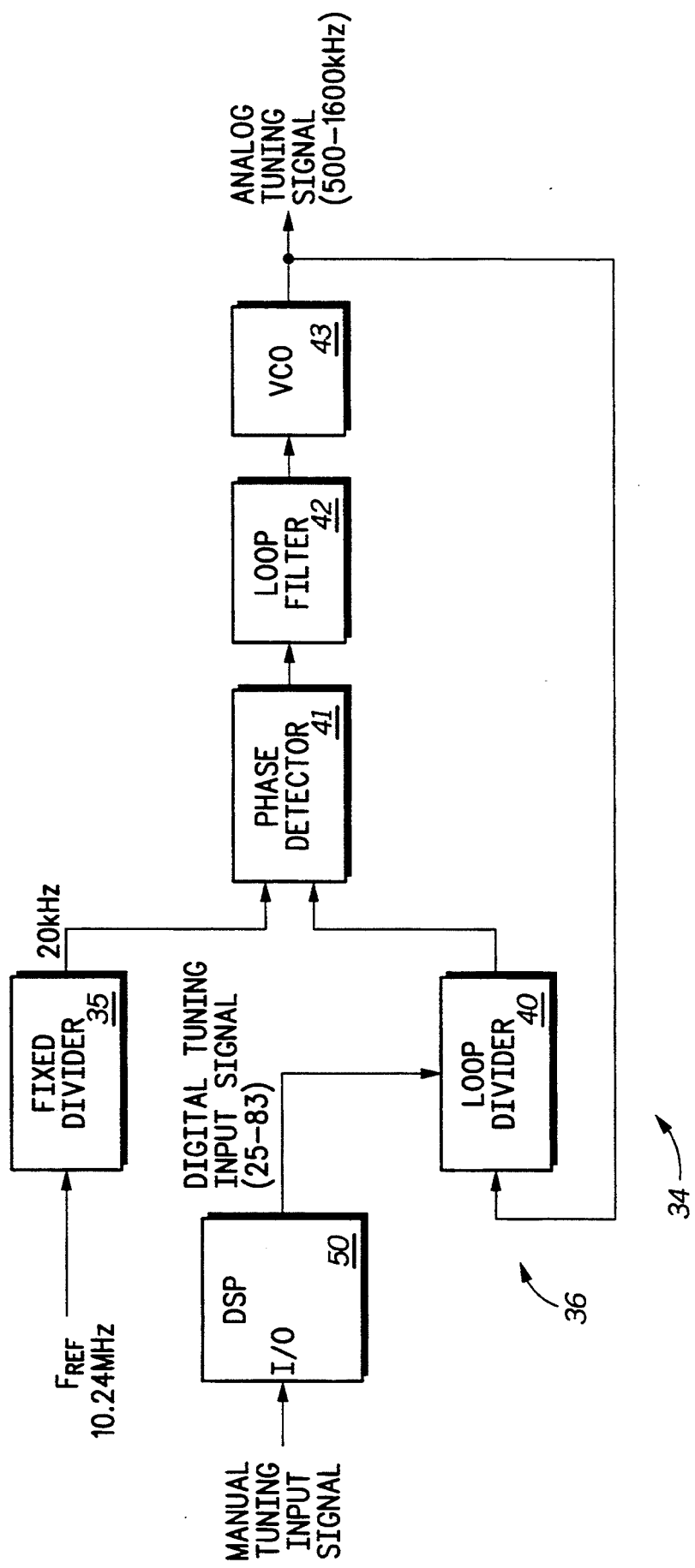
FIG. 2 illustrates in block diagram form a portion of the receiver of FIG. 1.

The present invention can be more fully understood with reference to FIGS. 1 and 2. FIG. 1 illustrates in partial block diagram, partial logic diagram, and partial schematic diagram form a receiver 20 with digital tuning in accordance with the present invention. Receiver 20 includes generally an antenna 21 and an electronic receiver 22. In the illustrated embodiment, receiver 20 forms an amplitude modulation (AM) stereo receiver. Antenna 21 receives a radio frequency (RF) signal over the commercial AM radio frequency range, namely 520 kilohertz (kHz) to 1680 kHz, labelled "AM STEREO RF SIGNAL". Electronic receiver 22 of receiver 20 has an input terminal 30 connected to antenna 21, an input for receiving a digital value labelled "DIGITAL TUNING INPUT SIGNAL", and two outputs providing signals labelled "LEFT" and "RIGHT" which are the left- and right-channel audio output signals, respectively.

Generally, receiver 22 includes an analog multiplier 31, a sigma-delta analog-to-digital converter (ADC) 32, a reference clock generator 33, and a digital tuning section 34. Analog multiplier 31 has a first input terminal coupled to input terminal 30 for receiving the AM STEREO RF SIGNAL, a second input terminal, and an output terminal for providing a tuned analog signal. ADC 32 has an input terminal connected to the output terminal of analog multiplier 31 for receiving the tuned analog signal, a clock input terminal, and an output terminal for providing a tuned digital signal. This tuned digital signal is a 16-bit digital value which ADC 32 provides at a rate of 80 kHz. Reference clock generator 33 provides a digital reference clock signal labelled "$F_{REF}$" and having a frequency of 10.24 megahertz (MHz) to the clock input terminal of ADC 32 and to digital tuning section 34.

Digital tuning section 34 includes generally a clock frequency divider 35, and a clock frequency multiplier 36. Clock frequency divider 35 has an input terminal for receiving $F_{REF}$, and an output terminal for providing a divided clock signal. In the illustrated embodiment, clock frequency divider 35 has a fixed divide ration of 512, and thus provides the divided clock signal at a frequency of 20 kHz. Clock frequency multiplier 36 has an input terminal connected to the output terminal of clock frequency divider 35, an input terminal for receiving DIGITAL TUNING INPUT SIGNAL, and an output terminal for providing an analog tuning input signal to the second input terminal of analog multiplier 31. DIGITAL TUNING INPUT SIGNAL may assume a value of between 25 and 83, inclusive, and thus ANALOG TUNING SIGNAL may assume values between 500 kHz and 1680 kHz, inclusive, at 20 kHz increments.

A digital demodulator 38 has an input terminal connected to the output terminal of ADC 32, and output terminals for providing signals LEFT and RIGHT. Note that digital demodulator 38 includes the functions of an AM demodulator, decimator, channel separator, and digital-to-analog converter. Digital demodulator 38 may be performed by any digital circuitry which performs these functions, but is preferably implemented by the demodulator taught by Funderburk et al. in U.S. Pat. No. 5,249,204, entitled "Circuit and Method for Phase Error Correction in a Digital Receiver", issued Sep. 28, 1993.

Consider an operation to tune receiver 20 at 520 kHz. Reference clock generator 33 always provides signal $F_{REF}$ at 10.24 MHz to digital tuning section 34, and fixed divider 35 divides $F_{REF}$ by 512, which yields a 20 kHz clock pulse. This clock pulse is fed into programmable multiplier 36 to increase the clock rate to a programmable clock rate. In the illustrated embodiment, fixed divider 35 and programmable multiplier 36 are implemented using a PLL circuit integrated with a general-purpose digital signal processor (DSP), which is further illustrated with reference to FIG. 2 below.

Programmable multiplier 36 receives a value of 25 as DIGITAL TUNING INPUT SIGNAL, and increases its clock rate by 25 times to provide ANALOG TUNING SIGNAL at 500 kHz. ANALOG TUNING SIGNAL is applied to an input of analog multiplier 31, which multiplies ANALOG TUNING SIGNAL by AM STEREO RF SIGNAL, which is received at input terminal 30, and which is to be tuned to 520 kHz. Analog multiplier 31 performs an analog multiplication in the time domain, which creates a difference term and a summation term of the two input frequencies, or 20 kHz and 1020 kHz carrier frequencies in this example. Since sigma-delta ADC 32 samples at a rate of 80 kHz, only the frequency band in the tuned analog signal up to 40 kHz is sampled and the rest of the frequency band above 40 kHz is digitally lowpass-filtered to the noise level. The tuned digital signal at the output of sigma-delta ADC 32 is fed into digital demodulator 38 to demodulate the QAM signal to baseband, which has a stereo (LEFT and RIGHT) signal with up to 20 kHz of bandwidth.

Receiver 20 uses several digital circuits which are frequently integrated with general-purpose DSPs, and thus minimizes cost. Furthermore, the only external analog component used in receiver 20 is analog multiplier 31. Thus, receiver 20 significantly reduces cost over known receivers.

FIG. 2 illustrates in block diagram form a portion of the receiver of FIG. 1, including tuning section 34 and a digital signal processor (DSP) 50. DSP 50 is a general-purpose DSP such as the DSP56002 available from Motorola, Inc. or the like. DSP 50 allows a human interface by receiving a signal labelled "MANUAL TUNING INPUT SIGNAL" from a general purpose input/output port labelled "I/O". MANUAL TUNING INPUT SIGNAL may be provided by any conventional human interface device such as a potentiometer, but is preferably provided by a device which discretely switches between settings such as a notched potentiometer, positive and negative increment buttons, or the like. DSP 50 also has an output to provide DIGITAL TUNING INPUT SIGNAL to tuning portion 34. In order to achieve maximum integration and lowest cost, tuning portion 34 is preferably implemented by circuitry integrated with DSP 50 on a single integrated circuit.

As illustrated in FIG. 1, fixed divider 35 has an input terminal for receiving signal $F_{REF}$, and an output terminal connected to an input terminal of clock frequency multiplier 36. Clock frequency multiplier 36 includes a loop divider 40, a phase detector 41, a loop filter 42, and a voltage controlled oscillator (VCO) 43. In the illustrated embodiment, clock frequency divider 35 and clock frequency multiplier 36 form a phase locked loop (PLL). It should be appreciated, however, that other circuits may be used to implement clock frequency divider 35 and clock frequency multiplier 36 as well.

Loop divider 40 has an input terminal for receiving ANALOG TUNING SIGNAL, a programmable divider input terminal for receiving DIGITAL TUNING INPUT SIGNAL, and an output terminal for providing a divided signal. Phase detector 41 has an input terminal for receiving the divided signals from clock frequency divider 35 and loop divider 40, and an output terminal for providing a phase detect output signal. Loop filter has an input terminal connected to the output terminal of phase detector 41, and an output terminal. It should be noted that in one embodiment of clock frequency multiplier 36, phase detector 41 includes a charge pump which provides pump up and pump down voltages at the output thereof, and loop filter 42 is a capacitor functioning as a lowpass filter. In this case, the input and output terminals of loop filter are the same terminal. VCO 43 has an input terminal connected to the output terminal of loop filter 42, and an output terminal for providing ANALOG TUNING SIGNAL.

While the invention has been described in the context of a preferred embodiment, it will be apparent to those skilled in the art that the present invention may be modified in numerous ways and may assume many embodiments other than that specifically set out and described above. For example, the disclosed receiver is applicable to other types of modulation and other systems besides AM stereo, such as FM stereo, cellular modem receivers, two-way radios, pagers, etc. Furthermore, a receiver according to the present invention may be implemented with other types of ADCs besides sigma-delta ADCs, as long as the tuned digital signal is sufficiently lowpass filtered. Accordingly, it is intended by the appended claims to cover all modifications of the invention which fall within the true spirit and scope of the invention.

We claim:

1. A receiver with digital tuning, comprising:
   an input terminal for receiving a modulated signal;
   an analog multiplier having a first input coupled to said input terminal, a second input for receiving an analog tuning signal, and an output for providing a tuned analog signal;
   an analog-to-digital converter (ADC) having an input for receiving said tuned analog signal, and an output for providing a tuned digital signal;
   divider means for receiving a reference clock signal, and for providing a first divided signal at a predetermined frequency in response thereto; and
   multiplier means coupled to said divider means, for receiving a digital tuning input signal and said first divided signal, and for providing said analog tuning signal at a frequency equal to a multiple of said predetermined frequency as determined by said digital tuning input signal.

2. The receiver of claim 1 wherein said multiplier means comprises:
   a loop divider having a first input for receiving said digital tuning input signal, a second input for receiving said analog tuning signal, and an output for providing a second divided signal;
   a phase detector having a first input for receiving said first divided signal, a second input for receiving said second divided signal, and an output for providing a phase detect output signal;
   a loop filter coupled to said output of said phase detector; and a voltage controlled oscillator having an input coupled to said loop filter, and an output for providing said analog tuning signal.

3. The receiver of claim 2 further comprising a data processor operably coupled to said loop divider having an input for receiving a manual tuning input signal, and an output for providing said digital tuning input signal in response thereto.

4. The receiver of claim 1 further comprising a demodulator having an input for receiving said tuned digital signal, and an output for providing at least one demodulated output signal.

5. The receiver of claim 1 wherein said modulated signal is characterized as being a radio frequency (RF) modulated signal.

6. The receiver of claim 1 wherein said ADC is characterized as being an oversampled ADC and has a clock input terminal for receiving said reference clock signal.

7. The receiver of claim 6 wherein said ADC comprises a sigma-delta ADC.

8. A receiver with digital tuning, comprising:
   an input terminal for receiving a modulated signal;
   an analog multiplier having a first input terminal coupled to said input terminal of the receiver, a second input terminal for receiving an analog tuning signal, and an output terminal for providing a tuned analog signal;
   an analog-to-digital converter (ADC) having an input terminal for receiving said tuned analog signal, and an output terminal for providing a tuned digital signal;
   a clock frequency divider having an input terminal for receiving a reference clock signal, and an output terminal for providing a first divided signal at a predetermined frequency in response thereto; and
   a clock frequency multiplier having an input terminal coupled to said output terminal of said clock frequency divider, a control input terminal for receiving a digital tuning input signal, and an output terminal for providing said analog tuning signal.

9. The receiver of claim 8 wherein said clock frequency multiplier comprises:
   a loop divider having a first input terminal for receiving said digital tuning input signal, a second input terminal for receiving said analog tuning signal, and an output terminal for providing a second divided signal;
   a phase detector having a first input terminal for receiving said first divided signal, a second input terminal for receiving said second divided signal, and an output terminal for providing a phase detect output signal;
   a loop filter coupled to said output terminal of said phase detector: and
   a voltage controlled oscillator having an input terminal coupled to said loop filter, and an output terminal for providing said analog tuning signal.

10. The receiver of claim 9 further comprising a data processor operably coupled to said loop divider, having an input terminal for receiving a manual tuning input signal, and an output terminal for providing said digital tuning input signal in response thereto.

11. The receiver of claim 8 further comprising a demodulator having an input terminal for receiving said tuned digital signal, and at least one output terminal for providing a demodulated output signal.

12. The receiver of claim 8 wherein said modulated signal is characterized as being a radio frequency (RF) modulated signal.

13. The receiver of claim 8 wherein said ADC is characterized as being an oversampled ADC and has a clock input terminal for receiving said reference clock signal.

14. The receiver of claim 13 wherein said ADC comprises a sigma-delta ADC.

15. A method for digitally tuning a receiver, comprising the steps of:

receiving a modulated signal at an input of the receiver;

multiplying said modulated signal by an analog tuning signal to provide a tuned analog signal;

converting said tuned analog signal to a tuned digital signal;

providing a first divided signal at a predetermined frequency;

receiving a digital tuning input signal; and providing said analog tuning signal having a frequency equal to a programmable multiple of said first divided signal as determined by said digital tuning input signal.

16. The method of claim 15 wherein said step of providing said first divided signal comprises the steps of:

receiving a reference clock signal; and dividing said reference clock signal by a predetermined number to provide said first divided signal.

17. The method of claim 15 wherein said step of providing said analog tuning signal comprises the steps of:

dividing said analog tuning signal by said digital tuning input signal to provide a second divided signal;

detecting a phase difference between said first and second divided signals to provide a phase detect output signal;

filtering said phase detect output signal to provide a filtered signal; and providing said analog tuning signal at a frequency proportional to said filtered signal.

18. The method of claim 15 further comprising the step of demodulating said tuned digital signal to provide a demodulated output signal.

19. The method of claim 15 wherein said step of receiving said modulated signal comprises the step of receiving a radio frequency (RF) modulated signal at said input of the receiver.

* * * * *